US006399874B1

United States Patent
Olah

(12) United States Patent
(10) Patent No.: US 6,399,874 B1
(45) Date of Patent: Jun. 4, 2002

(54) SOLAR ENERGY MODULE AND FRESNEL LENS FOR USE IN SAME

(75) Inventor: Stephen Olah, Chandler, AZ (US)

(73) Assignees: Charles Dennehy, Jr.; Sandra Dennehy, both of Lake Bluff, IL (US)

( * ) Notice: Subject to any disclaimer, the term of this patent is extended or adjusted under 35 U.S.C. 154(b) by 0 days.

(21) Appl. No.: 09/758,842

(22) Filed: Jan. 11, 2001

(51) Int. Cl.$^7$ .............................................. H01L 31/052
(52) U.S. Cl. ...................... 136/259; 136/246; 136/251; 359/742; 257/436; 257/433
(58) Field of Search ................................. 136/246, 259, 136/251; 126/698, 699; 359/742; 257/436, 433

(56) References Cited

U.S. PATENT DOCUMENTS

| 4,188,238 A | | 2/1980 | Boling |
| 4,379,944 A | | 4/1983 | Borden et al. |
| 4,495,938 A | | 1/1985 | Hanson |
| 4,498,456 A | | 2/1985 | Hashizume |
| 4,498,460 A | | 2/1985 | Mori |
| 4,545,366 A | | 10/1985 | O'Neill |
| 4,628,142 A | | 12/1986 | Hashizume |
| 4,653,472 A | * | 3/1987 | Mori ........................... 136/246 |
| 4,711,972 A | | 12/1987 | O'Neill |
| 4,848,319 A | | 7/1989 | Appeldorn |
| 4,904,063 A | * | 2/1990 | Okada et al. ................ 349/200 |
| 5,118,361 A | * | 6/1992 | Fraas et al. ................. 136/246 |
| 5,498,297 A | | 3/1996 | O'Neill et al. |
| 5,505,789 A | | 4/1996 | Fraas et al. |
| RE35,534 E | * | 6/1997 | Claytor ........................ 359/742 |
| 5,870,233 A | | 2/1999 | Benz et al. |
| 6,020,554 A | | 2/2000 | Kaminar et al. |
| 6,046,859 A | * | 4/2000 | Raj .............................. 359/649 |

OTHER PUBLICATIONS

Fresnel Technologies, Inc., Fresnel Lenses, Internet publication, 1995.

* cited by examiner

Primary Examiner—Alan Diamond
(74) Attorney, Agent, or Firm—Cook, Alex, McFarron, Manzo, Cummings & Mehler, Ltd.

(57) ABSTRACT

A solar concentrator having a housing that supports at least one photovoltaic cell therein. A heat sink underlies the photovoltaic cell and a transparent cover, preferably glass, protects the surface of the cell. Positive and negative contacts are operatively connected to the cell to transmit the electrical energy generated thereby. A primary optical concentrator is provided in the form of a Fresnel lens. The Fresnel lens has a central facet and a plurality of adjacent facets of varying widths, the width of each successive adjacent facet decreasing in the direction away from the central facet. The radius of curvature of each successive adjacent facet increases in the direction away from the central facet. All of the facets have a peak of the same height and a valley of the same height. The Fresnel lens has a predetermined focal distance and the photovoltaic cell is supported within the housing within the focal range of the lens and at a distance from the lens that is less than the focal distance.

4 Claims, 4 Drawing Sheets

SOLAR ENERGY MODULE AND FRESNEL LENS FOR USE IN SAME

BACKGROUND OF THE INVENTION

The present invention relates to a solar energy module and, more particularly, to a solar energy conversion module that converts solar energy into electrical energy, and to a Fresnel lens for use in such a conversion module.

Solar energy is frequently considered as a renewable alternative to the energy generated by fossil fuel that is predominantly used today. Of course, cost is a major factor in determining what source of energy to use, and one can reasonably expect that when the energy created through solar power conversion becomes cost competitive with that generated by fossil fuels, solar energy will come into wider use.

Solar energy conversion modules that convert sunlight into electrical energy typically employ photovoltaic or photoelectric cells that directly convert the solar energy into electrical energy. The amount of energy created by the cell is directly related to the amount of solar energy the cell absorbs; the amount of energy the cell absorbs is a function of both the size or surface area of the cell and the intensity or brightness of the sunlight that strikes the cell.

Relatively speaking, the photovoltaic cell is the most expensive component of a solar energy converter. Thus, increasing the electrical output of the converter by increasing the surface area of the photocells can quickly become very expensive, and other methods for increasing the intensity of the sunlight striking the photocell are usually employed. Such methods include using concentrator lenses and/or reflectors to focus the sunlight onto the photocell. See, e.g., U.S. Pat. No. 6,020,554, which utilizes a Fresnel lens (a lens having a stepped or grooved surface), in combination with reflectors adjacent the photovoltaic cell. Tracking mechanisms have also been developed that adjust the position of the solar energy converter as the sun travels across the sky so that the sun's rays more directly impinge upon the photocell. See, e.g., U.S. Pat. Nos. 4,628,142 and 4,498,456, both of which are incorporated by reference herein.

The size of the module also affects the cost in other, less direct ways. As most solar energy converters are manufactured remote from their installation site, shipping and final assembly costs can become significant. Clearly, shipping costs can be minimized by reducing the size of the converter module, and simplification of the overall structure can be reasonably expected to reduce assembly costs, as well as the cost of the solar collector itself.

Thus, the primary object of the present invention is to provide a solar energy converter of simplified construction that more accurately focuses the sun's rays onto the photocell.

It is a related object to provide such a solar energy converter that utilizes a single lens or primary optical concentrator for each photocell, and has no secondary optical concentrator, such as a further lens or reflector.

It is a further object to provide a unique lens configuration to be used as the primary optical concentrator for a solar energy converter that focuses solar energy with sufficient accuracy that no secondary optical concentrator is required.

SUMMARY OF THE INVENTION

These objects, as well as others which will become apparent upon reference to the following detailed description and accompanying drawings, are accomplished by a solar concentrator having a housing that supports at least one photovoltaic cell therein. A heat sink underlies the photovoltaic cell and a transparent cover, preferably glass, protects the surface of the cell. Positive and negative contacts are operatively connected to the cell to transmit the electrical energy generated thereby. A primary optical concentrator is provided in the form of a Fresnel lens. The Fresnel lens has a central facet and a plurality of adjacent facets of varying widths, the width of each successive adjacent facet decreasing in the direction away from the central facet. The radius of curvature of each successive adjacent facet increases in the direction away from the central facet. All of the facets have a peak of the same height and a valley of the same height. The Fresnel lens has a predetermined focal distance and the photovoltaic cell is supported within the housing within the focal range of the lens and at a distance from the lens that is less than the focal distance.

In a preferred embodiment, the solar energy converter comprises a plurality of Fresnel lens and photovoltaic cell combinations, each Fresnel lens having a central round facet surrounded by a plurality of concentric circular facets. The invention is also considered to comprise the unique Fresnel lens configuration by itself.

DETAILED DESCRIPTION OF THE PREFERRED EMBODIMENTS

Figure 1:
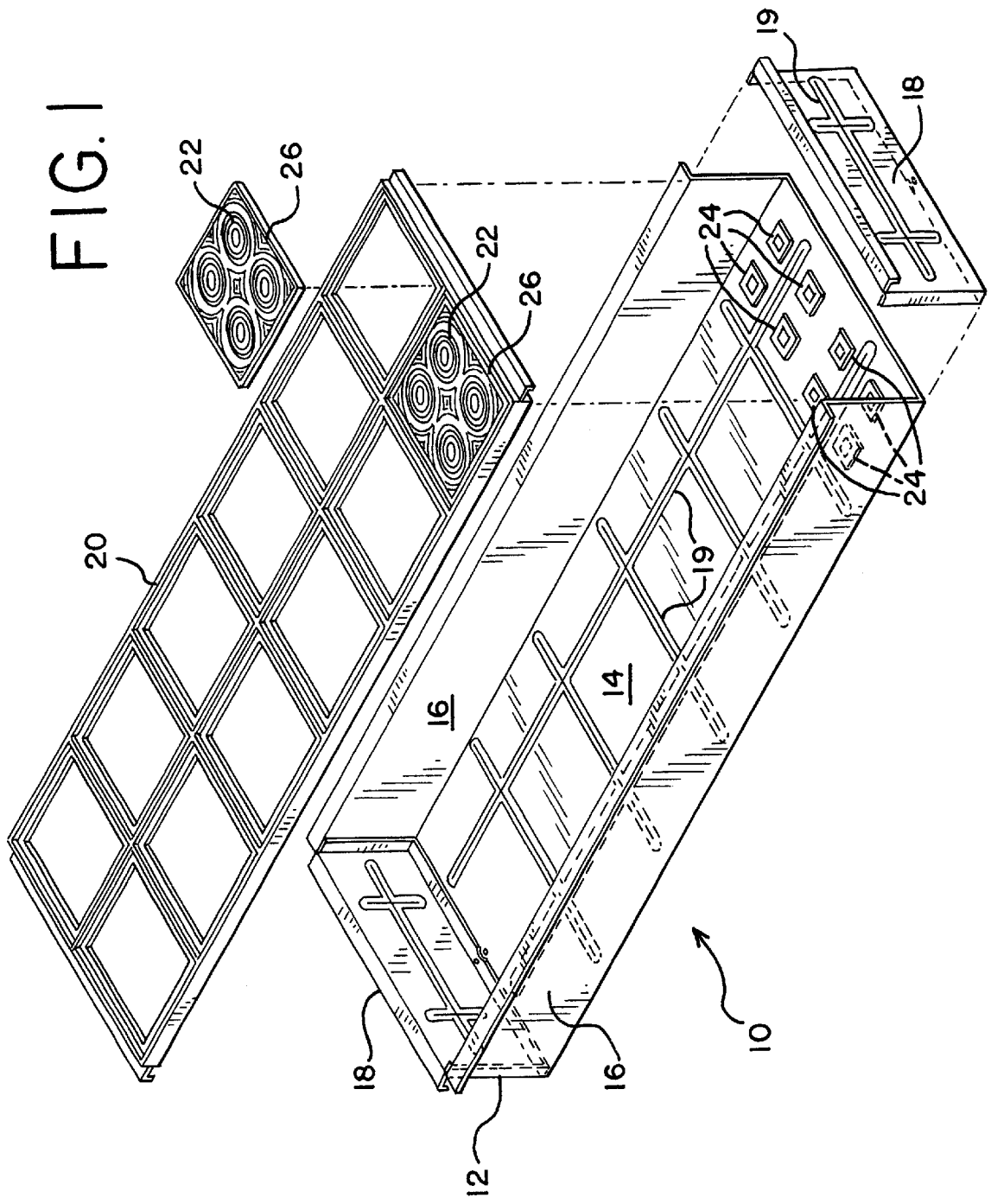
FIG. 1 is perspective view, partially exploded, showing a solar energy module according to the present invention.

With reference to FIG. 1, there is seen an exploded view of a solar energy module generally designated 10, in accordance with the present invention. The module 10 includes a housing 12 typically made of sheet metal by standard fabrication techniques. The housing 12 includes a bottom 14 and two side panel 16 formed in a u-shape from a single piece of sheet metal. The housing 14 also includes two separate end panels 18, which may be joined together with the bottom and side panels, by, e.g., spot welding. Preferably, the housing is made of 0.032 in sheet aluminum stamped by a blanking dye with reinforcing or stiffening ridges 19, with the overall dimensions being approximately 7 inches high by 20 inches wide by 60 inches long.

As illustrated, the module 10 includes a grid assembly 20 at its upper, open side. The grid assembly supports a series of lenses 22. Each lense 22 serving as the optical concentrator for an associated photovoltaic cell stack, generally indicated by 24, mounted to the bottom 14 on the inside of the module 10. The grid assembly 20 is preferably made of extruded aluminum, using the window frame fabrication method, with positive fixturing. This provides a high degree of dimensional accuracy and stability for the assembled module 10. The illustrated grid assembly 20 supports 12 optical concentrator assemblies or parquets 26 of four lenses each, with four photovoltaic cell stacks 24 associated with each lense parquet.

Figure 3:
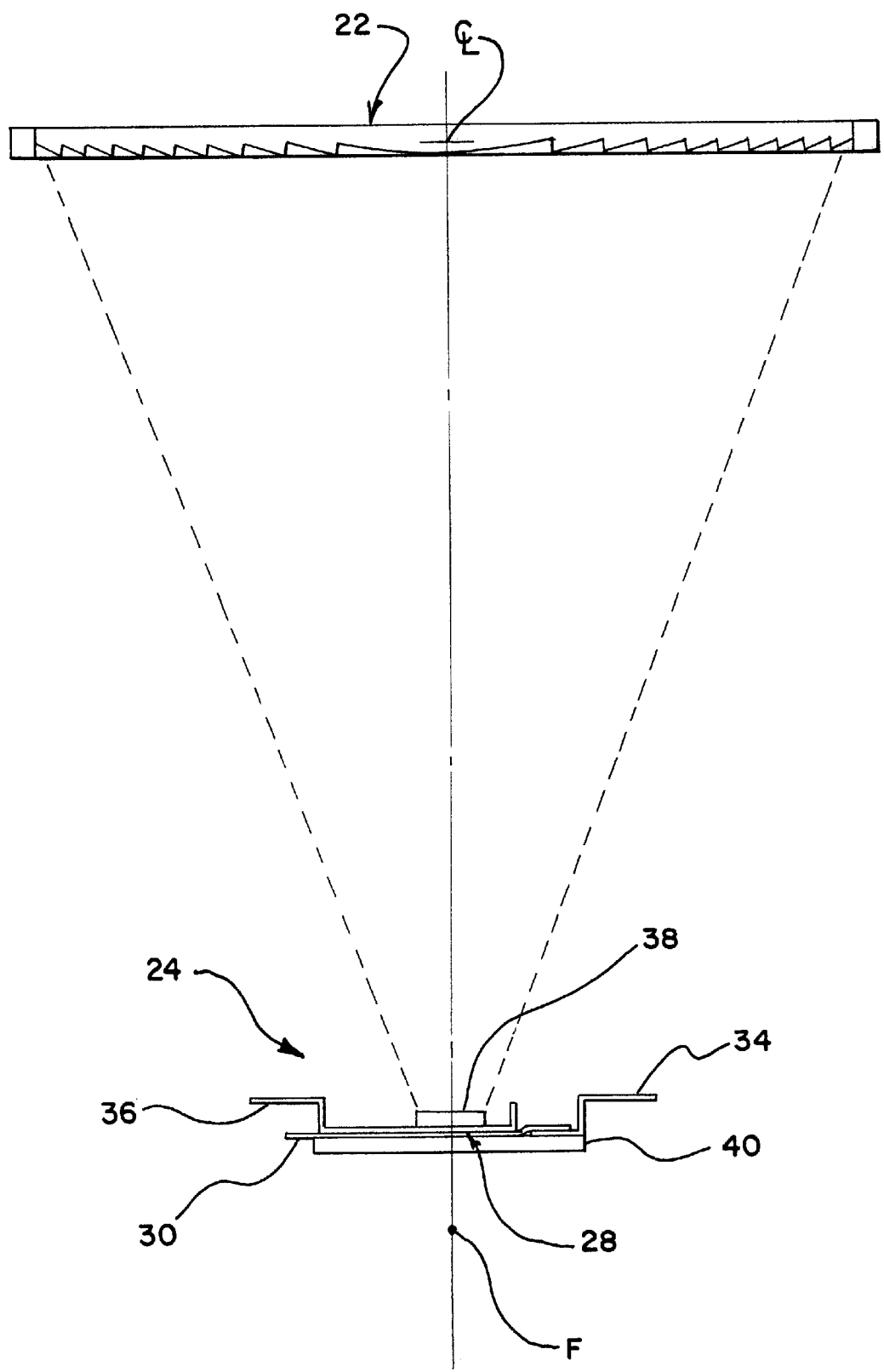
FIG. 3 is an enlarged view showing the relationship between a single Fresnel lens and its associated solar cell in accordance with the present invention.
Figure 4:
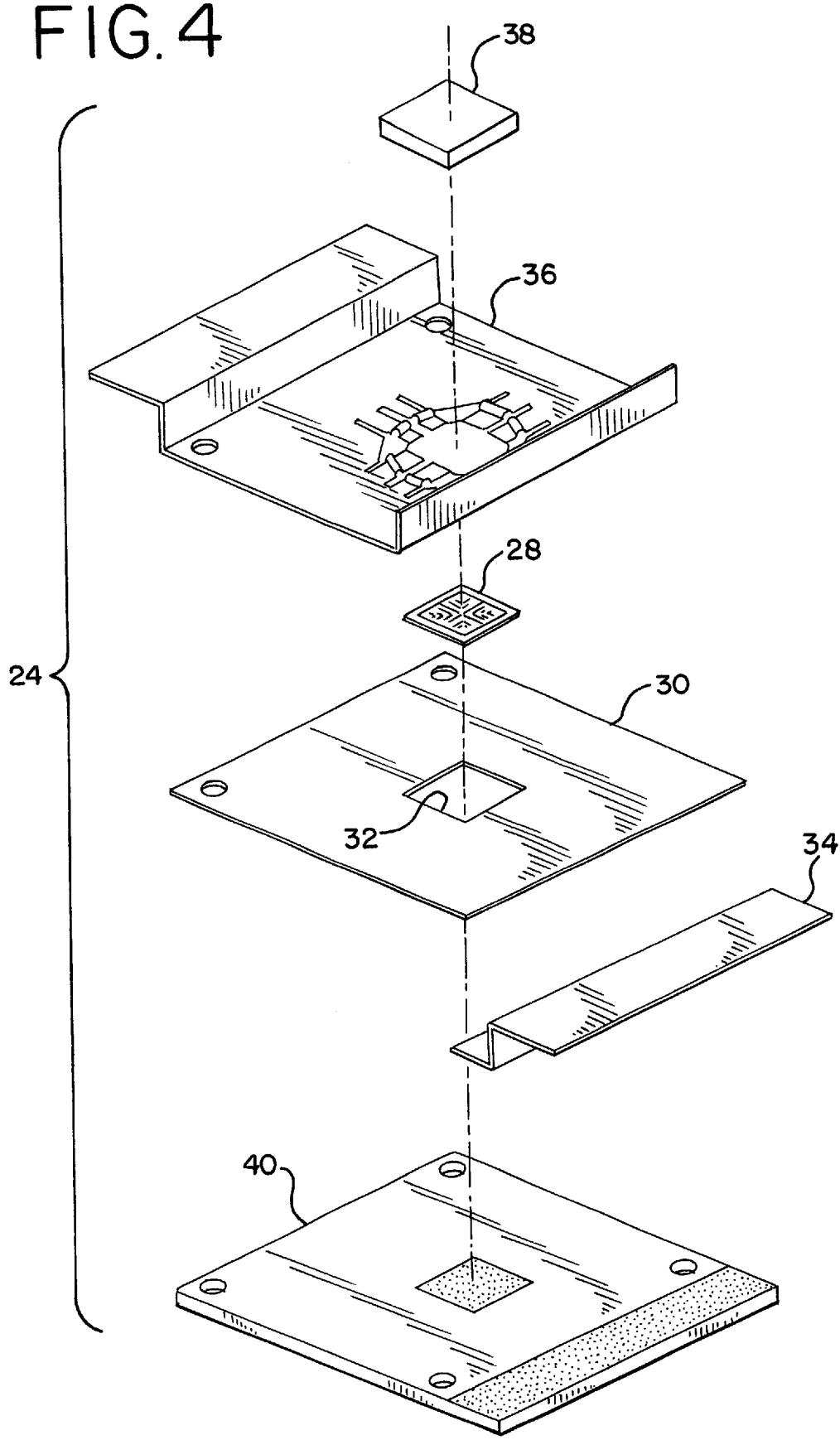
FIG. 4 is an exploded view of the solar cell stack components.

Turning to FIGS. 3 and 4, a representative cell stack 24 is shown. The cell stack 24 is of well-known construction and comprises a square (7 mm×7 mm) silicon photovoltaic cell 28 supported on an electrical insulator 30. The electrical insulator 30 has a central opening 32 that permits conductive contact between the cell 28 and a positive contact 34 made of solder-plated copper ribbon. A negative contact 36, also made of solder-plated copper ribbon, is in conductive contact with the top of the cell 28. A glass or other transparent protective cover 38 overlies the negative contact 36 and covers the cell 28 to protect it from the elements. The cell 28 and its associated contacts 34, 36 and insulator are secured to a heat sink 40 that includes solder screened onto the areas where contact is made with the other components. The cell stack 24 is preferably made using batch processing techniques, including solder re-flow technology and positive fixturing in an RF heat chamber. The mating components are pressed together after heating to create an homogenous void-free joint between the solar cell 28 and the heat sink 40. The cell assemblies 24 are interconnected by standard solder-tin coated copper braid (not shown), and electrical insulation between the cell assemblies and the module housing 12 is provided by a readily-available thermally conductive thin film (also not shown).

In keeping with the invention, only a single optical concentrator 22 is used for each cell stack 24. No secondary concentrator, such as a further lens or reflector, is required, as is prevalent in the prior art. To this end, each lense 22 comprises a specially configured Fresnel lens. The Fresnel lens has a central facet and a plurality of adjacent facets of varying widths. The width of each successive adjacent facet decreases in a direction away from the central facet, while the radius of curvature of each successive adjacent facet increases in a direction away from the central facet. The lens is configured so that all the facets have a peak of the same height and a valley of the same height, thus providing for a thin lens. The Fresnel lens is supported in the housing a distance above the photovoltaic cell that is less than the focal distance of the lens.

Figure 5:
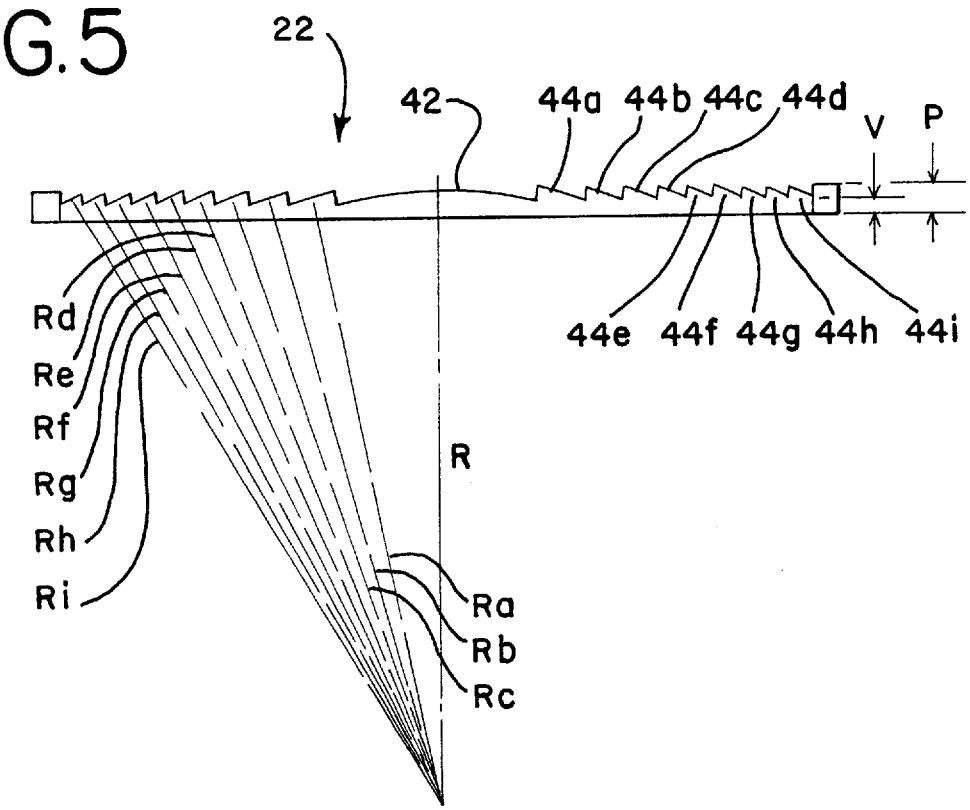
FIG. 5 is a cross-sectional view of a single Fresnel lens for use in the present invention taken along lines 5—5 of FIG. 2.

Turning to FIG. 5, the cross-section of a Fresnel lens in accordance with the present invention is shown. The Fresnel lens 22 has a central circular or round facet 42 and a series of concentric facets 44a–44i. The facets 42, 44a–44i are of varying widths, but all facets have peaks of the same height P and valleys of the same height V. In the illustrated embodiment the height P is the thickness of the lens and is 0.250 in., while the height of the valleys V is one-half the thickness of the lens, or 0.125 in. This results in a Fresnel lens having a thin cross-section dimension. To accomplish this, the radius of curvature of the facets increases as one progresses from the central facet 42 through each successive adjacent facet 44a–44i.

Figure 2:
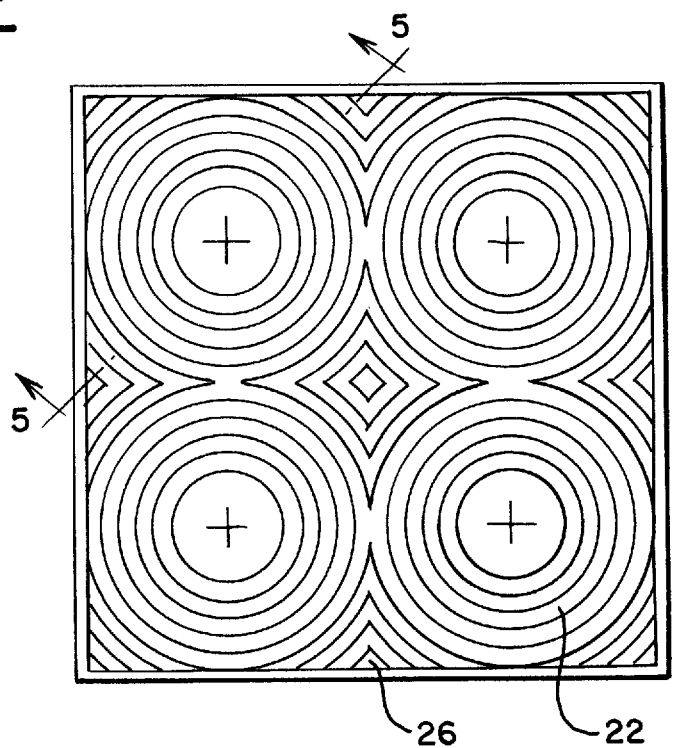
FIG. 2 is a plan view of a parquet of four Fresnel lenses for use in the solar energy module of the present invention.

With reference with the illustrated embodiment, there are 10 facets (best seen in FIG. 5), including the central facet, when viewed across the diagonal of each square Fresnel lens 22. (As seen in FIG. 2, each Fresnel lens has 6 "complete" or fully circular facets and 4 partial facets at the corners of the square lenses.) The central facet 42 has a radius of curvature R, with the successive adjacent facet 44a–44i having radii of curvature Ra-Ri, respectively. With each square Fresnel lens 22 in the parquet 26 measuring 4.5 in×4.5 in, the outer radius and the radius of curvature for each of the various facets is as follows:

TABLE I

| Facet Number | Radius of Curvature (inches) | Radius (inches) |
| --- | --- | --- |
| 42 | 4.00 | 0.968 |
| 44a | 4.140 | 1.375 |
| 44b | 4.250 | 1.687 |
| 44c | 4.356 | 1.968 |
| 44d | 4.456 | 2.218 |
| 44e | 4.590 | 2.437 |
| 44f | 4.700 | 2.641 |
| 44g | 4.800 | 2.828 |
| 44h | 4.900 | 3.016 |
| 44i | 5.000 | 3.180 |

Thus, the radius of curvature of the outer-most facet 44i is 1.25 times larger than that of the central facet 42 (i.e. 5.000/4.000). The resulting lens has a focal distance (the distance between the lens center line and the focal point F in FIG. 3) of 6.920 in. The cell stack 24 is of sufficient thickness so that the surface of the photovoltaic cell 28 is 6.650 in from the center line of the lens, i.e., within the focal distance of the lens. It is important that the surface of the photovoltaic cell 28 not be at the focal point of the lens because the heat generated by the concentration of the sun's rays may be sufficiently great at this point to damage the cell. The Fresnel lenses 22 are preferably made of HR-35 borosilicate glass, which provides both high light transmission and temperature resistance. The lens made by molding, with the lens mold made using computer numerical control technology.

Thus, a solar energy conversion module and a unique Fresnel lens for use in such a module have been provided that meets all the objects of the present invention. Because no secondary optical concentrator is required due to the optical characteristics of the Fresnel lenses used, the design and construction of the module is greatly simplified. While the invention has been described in terms of a preferred embodiment, there is no intent to limit the invention to the particular configuration illustrated in the drawings. For example, the Fresnel lens need not be round or circular in configuration. If the photovoltaic cell is elongated in one dimension, for example, elliptical in shape, rather than square in shape, the Fresnel lens may take a similar shape. Further, the number of facets in the Fresnel lens is a matter of design choice, and may vary from the ten facets shown in the preferred embodiment.

What is claimed:

1. A solar energy converter comprising:

a housing;

a primary optical concentrator supported by the housing in the form of a Fresnel lens made of glass and comprising a central facet and a plurality adjacent facets of varying width, the width of each successive adjacent facet decreasing in the direction away from the central facet, each successive adjacent facet having a radius of curvature that increases in the direction away from the central facet, and all the facets having a peak of the same height and a valley of the same height, the Fresnel lens having a focal distance;

a photovoltaic cell supported in the housing within the focal range of the lens and at a distance from the lens that is less than the focal distance;

a heat sink underlying the photovoltaic cell;

positive and negative contacts operatively connected to the solar cell;

a transparent cover over the solar cell; and the solar energy converter being free of any secondary optical concentrator or reflective device associated with the photovoltaic cell.

2. The solar energy converter of claim 1 wherein the central facet of the Fresnel lens is round and the adjacent facets are concentric with the central facet.

3. The solar energy converter of claim 1 wherein the number of concentric circular facets for the Fresnel lens is nine.

4. The solar energy converter of claim 1 wherein a radius of curvature of the outermost facet of the Fresnel lens is 1.25 times greater than a radius of curvature of the central facet.

* * * * *